United States Patent [19]

Brehmer et al.

[11] Patent Number: 4,849,708

[45] Date of Patent: Jul. 18, 1989

[54] FULLY DIFFERENTIAL NON-LINEAR AMPLIFIER

[75] Inventors: Geoffrey E. Brehmer; Harry S. Jackson, both of Austin, Tex.

[73] Assignee: Advanced Miere Devices, Inc., Sunnyvale, Calif.

[21] Appl. No.: 213,546

[22] Filed: Jun. 30, 1988

[51] Int. Cl.$^4$ .............................. H03F 3/45
[52] U.S. Cl. .................... 330/110; 307/562; 330/260
[58] Field of Search ............. 330/69, 86, 110, 260, 330/261, 256, 285, 282; 307/554, 555, 562, 568

[56] References Cited

PUBLICATIONS

"Fet Limits and Resets Operational Amplifiers", *Electronic Design*, Nov. 8, 1963, pp. 54–56.

*Primary Examiner*—James B. Mullins
*Attorney, Agent, or Firm*—Davis Chin

[57] ABSTRACT

A fully differential non-linear amplifier includes an operational amplifier (12), a first input resistor (R1), a second input resistor (R2), a first feedback resistor (R3), a second feedback resistor (R4), a first clamping network (CN1), and a second clamping network (CN2). The first clamping network (CN1) is formed of a first P-channel clamping transistor (P10) and a first N-channel clamping transistor (N10). The second clamping network (CN2) is formed of a second P-channel clamping transistor (P12) and a second N-channel clamping transistor (N12). The gates of the first and second P-channel clamping transistors (P10, P12) are connected to receive a P-bias signal. The gates of the first and second N-channel clamping transistors (N10, N12) are connected to receive a N-bias signal. The non-linear amplifier clamps its differential output signal to a constant voltage level independent of variations in process and temperature.

12 Claims, 2 Drawing Sheets 4,849,708

FULLY DIFFERENTIAL NON-LINEAR AMPLIFIER

BACKGROUND OF THE INVENTION

This invention relates generally to non-linear amplifiers and more particularly, it relates to a fully differential non-linear amplifier which is responsive to large differential input signals for clipping or clamping its differential output signal to a constant voltage level independent of variations in process and temperature.

In the prior art, there are known non-linear amplifiers of the type in which their outputs are linear for small signal levels and are clipped or clamped to a known voltage level for large signal levels. However, the difficulty encountered with such prior art amplifiers was that the known voltage level at which the clipping or clamping occurred was not constant and varied substantially over process and temperature conditions.

It would therefore be desirable to provide a fully differential non-linear amplifier which has a clipping/clamping voltage level which is substantially constant over all process and temperature conditions. The fully differential non-linear amplifier of the present invention includes four clamping transistors connected in a feedback loop of an operational amplifier. The clamping transistors function as diodes for large input signals so as to clamp the output signal to a constant voltage level.

SUMMARY OF THE INVENTION

Accordingly, it is a general object of the present invention to provide an improved fully differential non-linear amplifier which is relatively simple and economical to manufacture and assemble, but yet overcomes the disadvantages of the prior art amplifiers.

It is an object of the present invention to provide a fully differential non-linear amplifier which clamps its differential output voltage to a constant level independent of variations in process and temperature.

It is another object of the present invention to provide a fully differential non-linear amplifier which includes clamping transistors formed in a feedback loop of an operational amplifier for clamping its differential output signal to a constant voltage for large differential input signals.

It is still another object of the present invention to provide a single-ended non-linear amplifier which clamps its output voltage to a constant voltage level independent of variations in process and temperature.

It is still yet another object of the present invention to provide a single-ended non-linear amplifier which includes a pair of clamping transistors connected in a feedback loop for clamping its output voltage to a constant level for large input signals.

In the preferred embodiment of the present invention, the fully differential non-linear amplifier, which clamps its differential output signal to a constant voltage level independent of variations in process and temperature, includes an operational amplifier, a first input resistor, a second input resistor, a first feedback resistor, a second feedback resistor, a first clamping network, and a second clamping network. The operational amplifier has first and second input nodes, and first and second output nodes for producing a differential output signal thereacross. The first input resistor is connected between a first input terminal and the first input node. The second input resistor is connected between a second input terminal and the second input node. The first feedback resistor is connected between the first input node and the first output node. The second feedback resistor is connected between the second input node and the second output node. The first and second input terminals are connected to receive a differential input signal thereacross.

The first clamping network is formed of a first P-channel clamping transistor and a first N-channel clamping transistor. The first P-channel clamping transistor has its conduction path electrodes connected between the first input node and the first output node and has its gate connected to receive a P-bias signal. The first N-channel clamping transistor has its conduction path electrodes connected between the first input node and the first output node and has its gate connected to receive an N-bias signal. The second clamping network is formed of a second P-channel clamping transistor and a second N-channel clamping transistor. The second P-channel clamping transistor has its conduction path electrodes connected between the second input node and the second output node and has its gate connected to receive the P-bias signal. The second N-channel clamping transistor has its conduction path electrodes connected between the second input node and the second output node and has its gate connected to receive the N-bias signal.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figures 1, 2:
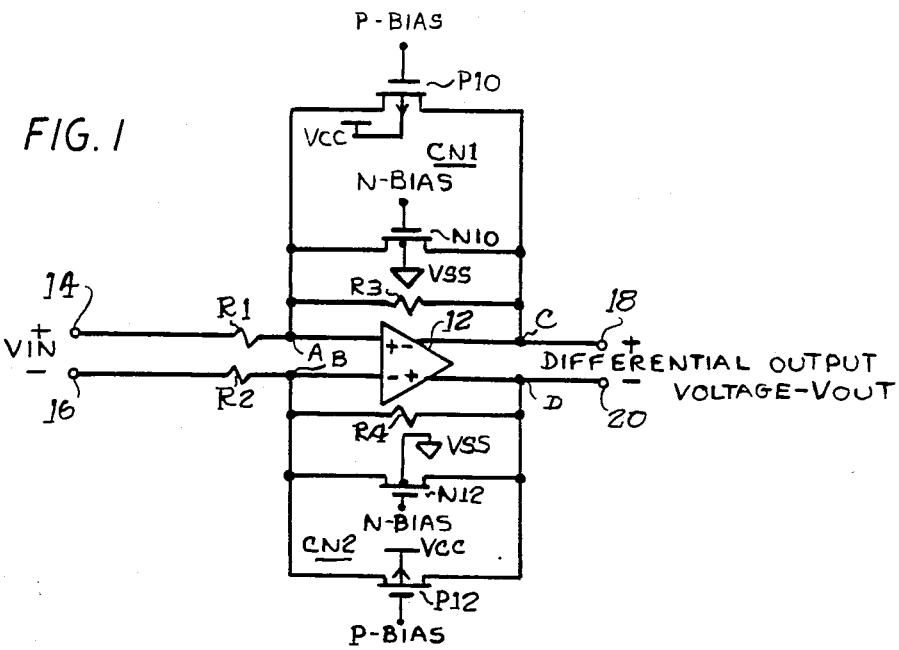
FIG. 1 is a schematic circuit diagram of a fully differential non-linear amplifier of the present invention.
FIG. 2 is a schematic circuit diagram of a clamp biasing circuit for use with the amplifier of FIG. 1.

Referring now in detail to the drawings, there is shown in FIG. 1 a schematic circuit diagram of a fully differential non-linear amplifier 10 of the present invention. The non-linear amplifier 10 functions as a linear inverting amplifier to provide a differential output signal having a gain of two for small differential input signals and functions to clamp or clip the differential output signal to a constant voltage level independent of variations in process and temperature for large differential input signals. The non-linear amplifier 10 is comprised of a double-ended operational amplifier 12 which has a pair of input nodes A, B and a pair of output nodes C, D.

The input node A is coupled to a first input terminal 14 via a first input resistor R1, and the input node B is coupled to a second input terminal 16 via a second input resistor R2. The input terminals 14 and 16 are connected to receive a differential input signal VIN. Each of the resistors R1 and R2 has a resistance value of R. The output node C is connected to a first output terminal 18, and the output node D is connected to a second output terminal 20. The output terminals 18 and 20 produce a differential output signal VOUT. As is conventional, the single-ended voltage on output terminal 18 is inverted from the single-ended input signal on input terminal 14. Similarly, the single-ended output signal on output terminal 20 is inverted from the single-ended output signal on input terminal 16. Therefore, it should be understood that only one side of the operational amplifier 12 could be used so as to form a single-ended non-linear amplifier.

The non-linear amplifier 10 further includes a first feedback resistor R3, a first clamping network CN1, a second feedback resistor R4, and a second clamping network CN2. The first feedback resistor R3 is connected between the first input node A and the first output node C. The first clamping network CN1 is formed of a first P-channel clamping transistor P10 and a first N-channel clamping transistor N10. Similarly, the second feedback resistor R4 is connected between the second input node B and the second output node D. The second clamping network CN2 is formed of a second P-channel clamping transistor P12 and a second N-channel clamping transistor N12. Each of the resistors R3 and R4 has a resistance value of 2R. For convenience, the N-channel transistors will be identified by the letter N followed by a particular reference numeral and the P-channel transistors will be identified by the letter P followed by a particular reference numeral.

The conduction paths defined by the source and drain electrodes of the clamping transistors P10 and N10 are also connected between the first input node A and the first output node C in parallel with the first feedback resistor R3. The conduction paths defined by the source and drain electrodes of the clamping transistors P12 and N12 are also connected between the second input node B and the second output node D in parallel with the second feedback resistor R4. The gates of the first and second P-channel clamping transistors P10 and P12 are connected to receive a P-channel bias signal P-BIAS. The gates of the first and second N-channel clamping transistors N10 and N12 are connected to receive an N-channel bias signal N-BIAS. In common implementation, the bulk of the clamping transistors P10 and P12 are connected to the substrate and to a supply voltage or potential VCC, which is typically at +5.0 volts, and the bulk of the clamping transistors N10 and N12 are connected to a ground potential VSS.

In FIG. 2, there is shown a schematic circuit diagram of a clamp biasing circuit 22 for generating the P-channel bias signal P-BIAS and the N-channel bias signal N-BIAS which are used by the first and second clamping networks CN1 and CN2 of the non-linear amplifier 10. The biasing circuit 22 is formed of a P-bias circuit section 24 and an N-channel bias circuit section 26. The P-channel bias circuit section 24 includes a reference current source IBIAS, an N-channel current mirror arrangement formed of N-channel transistors N1–N4, and a gm-connected P-channel MOS transistor P1.

The transistor N2 has its gate and drain electrodes connected together and to the source of the transistor N1. The transistor N2 has its source connected to the ground potential VSS. The transistor N1 has its gate and drain electrodes connected together and to one end of the current source IBIAS. The other end of the current source is connected to the supply potential VCC.

The transistor N3 has its drain connected to the source of the transistor N4, its gate connected to the gate of the transistor N2, and its source connected to the ground potential VSS. The transistor N4 has its drain connected to the drain of the transistor P1 and its gate connected to the gate of the transistor N1. The transistor P1 has its source connected to a reference voltage P-REFERENCE. The gate and drain electrodes of the transistor P1 are connected together and generate the P-channel bias signal at node E for the gates of the P-channel clamping transistors P10 and P12. Thus, the signal P-BIAS is designed to be one threshold drop $V_{TH}$ below the reference voltage P-REFERENCE.

The N-BIAS circuit section 26 includes an N-channel current mirror arrangement formed of N-channel transistors N1, N2, N5 and N6; a P-channel current mirror arrangement formed of P-channel transistors P2-P5; and a gm-connected N-channel MOS transistor N7. The transistor N5 has its drain connected to the source of the transistor N6, its gate connected to the gate of the transistor N2, and its source connected to the ground potential VSS. The transistor N6 has its gate connected to the gate of the transistor N1 and its drain connected to the drain of the transistor P2. The transistor P2 has its source connected to the drain of the transistor P3 and its gate and drain electrodes connected together. The transistor P3 has its source connected to the supply potential VCC and its gate and drain electrodes connected together. The transistor P4 has its source connected also to the supply potential VCC, its gate connected to the gate of the transistor P3, and its drain connected to the source of the transistor P5. The transistor P5 has its gate connected to the gate of the transistor P2 and its drain connected to the drain of the transistor N7. The transistor N7 has its gate and drain electrodes connected together and generates the N-channel bias signal at node F for the gates of the N-channel clamping transistors N10 and N12. The transistor N7 has its source connected to a reference voltage N-REFERENCE. Thus, the signal N-BIAS is designed to be one threshold voltage drop $V_{TH}$ above the reference voltage N-REFERENCE.

It should be noted that each of the N-channel transistors N1 through N6 has its source connected to its bulk. Further, the gm-connected N-channel transistor N7 has its bulk connected to the ground potential VSS. Each of the P-channel transistors P2 through P5 has its bulk connected to the supply potential VCC. The bulk of the gm-connected P-channel transistor P1 is also connected to the supply potential VCC. In the embodiment illustrated, the reference voltage P-REFERENCE is selected to be a constant 3.4 volts and the reference voltage N-REFERENCE is selected to be a constant 1.4 volts. Since the bulk of the transistor P1 is tied to the supply potential VCC, the P-channel bias signal appearing at the node E will be approximately 1.0 volts below the reference voltage P-REFERENCE or 2.4 volts. Since the substrate of the transistor N7 is tied to the ground potential VSS, the N-channel bias signal appearing at the node F will be approximately 1.0 volts above the reference voltage N-REFERENCE or 2.4 volts.

Figure 3:
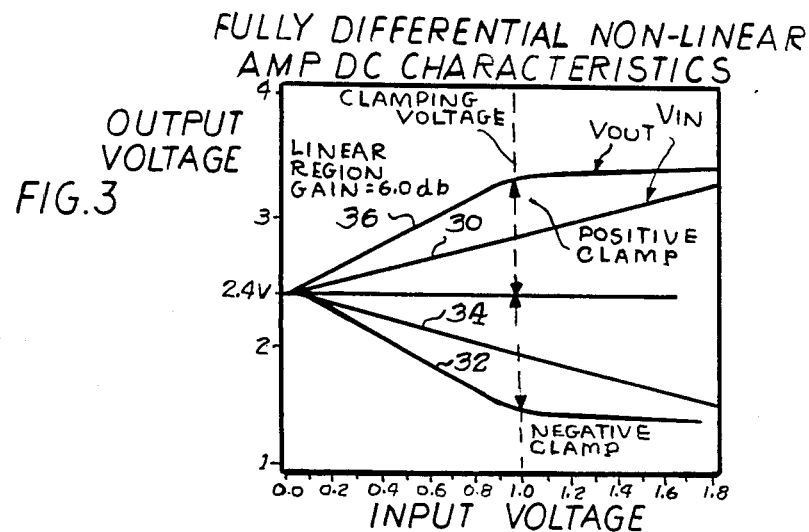
FIG. 3 illustrates the dc characteristics for each single-ended side of the amplifier of FIG. 1.

Referring to FIG. 3, there is shown the dc characteristics for each single-ended side of the non-linear amplifier 10 of FIG. 1. The operation of the amplifier 10 will now be explained with reference to FIG. 3. Initially, it is assumed that each input node of the nodes A, B defining a null port is at a constant voltage of 2.4 volts. Further, when the differential output voltage VOUT is at zero volts, each of the output nodes C and D will be at an analog reference voltage of 2.4 volts. Thus, the source and drain voltages across all of the clamping transistors P10, P12, N10 and N12 will be at the same potential. Since the signal N-BIAS will be at approximately 2.4 volts, the gate-to-source voltage for the N-channel clamping transistors N10 and N12 will be below the threshold voltage, thereby rendering them to be non-conductive. Similarly, since the signal P-BIAS will also be at approximately 2.4 volts, the gate-to-source voltage for the P-channel clamping transistors P10 and P12 will be above the threshold voltage, thereby rendering them to be likewise non-conductive.

By applying a positive ramping input voltage $V_{IN}$, as illustrated in curve 30 of FIG. 3, to the input terminal 14, the output voltage $V_{OUT}$ on the output terminal 18 will follow the curve 32. As the output signal $V_{OUT}$ decreases below 2.4 volts, the electrode of the transistor N10 connected to the output node C of the amplifier 10 defines its source and the electrode of the transistor P10 connected to the input node A defines its source. When the output signal $V_{OUT}$ decreases below the reference voltage N-REFERENCE or 1.4 volts, the transistor N1 is turned on and functions as a diode so as to clamp the output node C at one volt below the analaog reference of 2.4 volts. Further, the transistor P10 will be maintained to be non-conductive during this time since its gate-to-source voltage will always be higher than its threshold voltage.

By applying a negative ramping input signal $V_{IN}$, as illustrated in curve 34 of FIG. 3, to the input terminal 16, the output signal $V_{OUT}$ on the output terminal 20 will follow the curve 36. As the output signal $V_{OUT}$ increases above 2.4 volts, the electrode of the transistor P12 connected to the output node D of the amplifier 10 defines its source and the electrode of the transistor N12 connected to the input node B defines its source. When the output signal $V_{OUT}$ increases above the reference voltage P-REFERENCE or 3.4 volts, the transistor P12 is turned on and functions as a diode so as to clamp the output node D at one volt above the analog reference voltage of 2.4 volts. Further, the transistor N12 will be maintained to be non-conductive during this time since its gate-to-source voltage will always be lower than its threshold voltage.

It should be apparent that the N-channel clamping transistors N10 and N12 and the P-channel clamping transistors P10 and P12 will operate in a similar manner when the negative and positive ramping input signals (curves 34 and 30) are applied to the input terminals 14 and 16. Thus, the reverse operation of the clamping transistors N10, N12, P10 and P12 will not be described in detail.

The clamping point of the present amplifier 10 can be easily changed by adjusting the level of the reference voltages P-REFERENCE and N-REFERENCE. Further, the clamping point of the amplifier will remain substantially constant at the same voltage level independent of variations in process and temperature conditions. This is because when the process and temperature changes the threshold voltage of the clamping transistors N10, P10, N12 and P12, the levels of the bias signal P-BIAS and N-BIAS will be change proportionally. This is achieved by matching geometrically the transistor P1 of the clamp biasing circuit 22 with the clamping transistors P10 and P12. Similarly, the transistor N7 of the clamp biasing circuit 22 is matched geometrically with the N-channel clamping transistors N10 and N12.

For example, with particular reference to the N-channel clamping transistor N10, it will be recalled that the N-channel bias signal N-BIAS is made to be one threshold drop $V_{TH}$ above the reference voltage N-REFERENCE. As the process or temperature varies the threshold drop $V_{TH}$ of the clamping transistor N10, the threshold drop $V_{TH}$ in the gm-connected transistor N7 will vary proportionally and thus the clamp voltage of the amplifier will remain substantially at the same level. If the threshold voltage of the clamping transistor N10, for instance, is increased by 100 mV, the level of the N-channel bias signal N-BIAS will also be increased by 100 mV.

Figure 4:
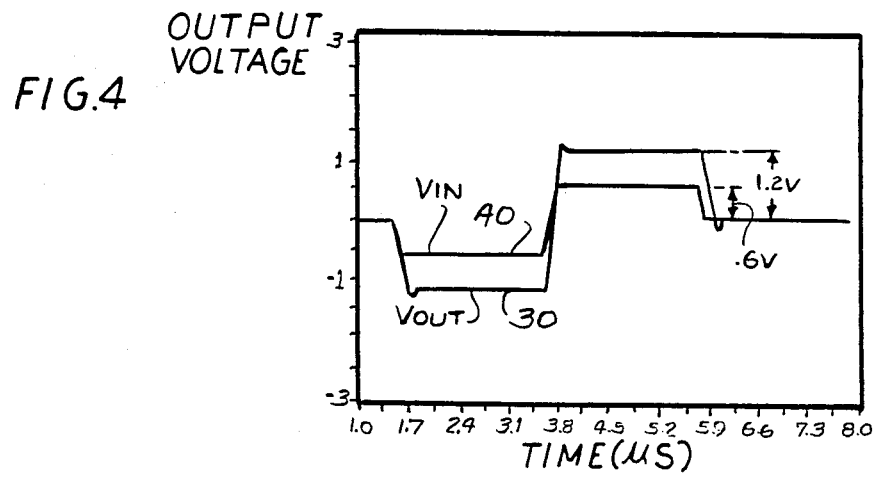
FIG. 4 are waveforms illustrating the differential output signal in response to a small differential input signal.
Figure 5:
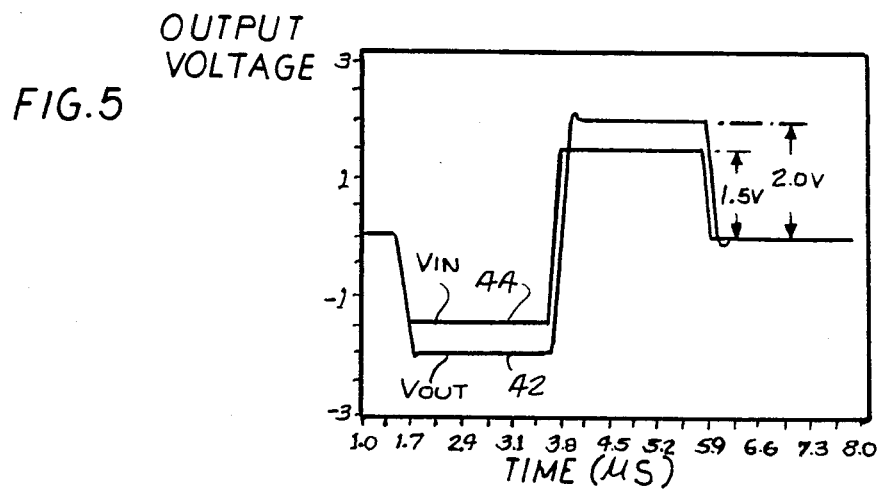
FIG. 5 are waveforms illustrating the differential output signal in response to a large differential input signal.

In FIG. 4, there is depicted a waveform of the differential output voltage VOUT (curve 38) of the nonlinear amplifier 10 in response to a small differential input signal VIN (curve 40). In this condition, the amplifier is operated in the linear region with a gain of two. In FIG. 5, there is illustrated the waveform of the differential output signal VOUT (curve 42) of the amplifier 10 in response to a large differential input signal VIN (curve 44). In this condition, the amplifier 10 is operated in the non-linear region and the differential output voltage is limited to 2.0 volts.

From the foregoing detailed description, it can thus be seen that the present invention provides an improved fully differential non-linear amplifier which is responsive to large differential input signals for clamping its output signal to a constant voltage level independent of variations in process and temperature. The non-linear amplifier of the present invention is formed of a double-ended operational amplifier, a first input resistor, a second input resistor, a first feedback resistor, a second feedback resistor, a first clamping network, and a second clamping network. Each of the first and second clamping networks are formed of a P-channel transistor and an N-channel transistor.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A fully differential non-linear amplifier which clamps its differential output signal to a constant voltage level independent of variations in process and temperature, said amplifier comprising:

operation amplifier means (12) having first and second input nodes, and first and second output nodes for producing a differential output signal thereacross;

a first input resistor (R1) connected between an input terminal and said first input node;

a second input resistor (R2) connected between a second input terminal and said second input node;

said first and second input terminal being connected to receive a differential input signal thereacross;

a first feedback resistor (R3) connected between the first input node and the first output node;

a second feedback resistor (R4) connected between the second input node and the second output node;

a first clamping network (CN1) formed of a first P-channel clamping transistor (P10) and a first N-channel clamping transistor (N10);

said first P-channel clamping transistor (P10) having its conduction path electrodes being connected between the first input node and the first output node and having its gate connected to receive a P-bias signal;

said first N-channel clamping transistor (N10) having its conduction path electrodes connected between the first input node and the first output node and having its gate connected to receive an N-bias signal;

a second clamping network (CN2) formed of a second P-channel clamping transistor (P12) and a second N-channel clamping transistor (N12);

said second P-channel clamping transistor (P12) having its conduction path electrodes connected between the second input node and the second output node and having its gate connected to receive the P-bias signal;

said second N-channel clamping transistor (N12) having its conduction path electrodes connected between the second input node and the second output node and having its gate connected to receive the N-bias signal;

clamp biasing circuit means (22) being responsive to a first reference voltage (P-REFERENCE) for generating the P-bias signal and being responsive to a second reference voltage (N-REFERENCE) for generating the N-bias signal, said P-bias signal being one threshold drop below said first reference voltage, said N-bias signal being one threshold drop above said second reference voltage; and said clamp biasing circuit (22) including a P-bias circuit section (24) formed of a reference current source (IBIAS), a first current mirror arrangement (N1–N4), and a gm-connected P-channel transistor (P1), and an N-bias circuit section (26) formed of a second current mirror arrangement (N1, N2, N5, N6), a third current mirror arrangement (P2–P5), and a gm-connected N-channel transistor (N7).

2. A non-linear amplifier as claimed in claim 1, wherein said gm-connected P-channel transistor (P1) is geometrically matched to said first and second P-channel clamping transistors (P10–P12).

3. A non-linear amplifier as claimed in claim 2, wherein said gm-connected N-channel transistor (N7) is geometrically matched to said first and second N-channel clamping transistors (N10, N12).

4. A non-linear amplifier as claimed in claim 1, wherein said first P-channel clamping transistor (P10) is turned on only when a first output voltage on the first output node increases above said first reference voltage (P-REFERENCE).

5. A non-linear amplifier as claimed in claim 4, wherein said first N-channel clamping transistor (N10) is turned on only when the first output voltage on the first output node decreases below said second reference voltage (N-REFERENCE).

6. A non-linear amplifier as claimed in claim 5, wherein said second P-channel clamping transistor (P12) is turned on only when a second output voltage on the second output node increases above said first reference voltage (P-REFERENCE).

7. A non-linear amplifier as claimed in claim 6, wherein said second N-channel clamping transistor (N12) is turned on only when the second output voltage on the second output node decreases below said second reference voltages (N-REFERENCE).

8. A single-ended non-linear amplifier which clamps its output signal to a constant voltage level independent of variations of process and temperature, said amplifier comprising:

operational amplifier means (12) having an input node, and an output node for producing an output signal;

an input resistor (R1) connected between an input terminal and the input node;

said input terminal being connected to receive an input signal;

a feedback resistor (R3) connected between the input node and the output node;

a clamping network (CN1) formed of a P-channel clamping transistor (P10) and an N-channel clamping transistor (N10);

said P-channel clamping transistor (P10) having its conduction path electrodes connected between the input node and the output node and having its gate connected to a P-bias signal;

said N-channel clamping transistor (N10) having its conduction path electrodes connected between the input node and the output node and having its gate connected to receive an N-bias signal;

clamp biasing circuit means (22) being responsive to a first reference voltage (P-REFERENCE) for generating the P-bias signal and being responsive to a second reference voltage (N-REFERENCE) for generating the N-bias signal, said P-bias signal being one threshold drop below said first reference voltage, said N-bias signal being one threshold drop above said second reference voltage; and said clamp biasing circuit (22) including a P-bias circuit section (24) formed of a reference current source (IBIAS), a first current mirror arrangement (N1–N4), and a gm-connected P-channel transistor (P1), and an N-bias circuit section (26) formed of a second current mirror arrangement (N1, N2, N5, N6), a third current mirror arrangement (P2–P5), and a gm-connected N-channel transistor (N7).

9. A non-linear amplifier as claimed in claim 8, wherein said gm-connected P-channel transistor (P1) is geometrically matched to said P-channel clamping transistor (P10).

10. A non-linear amplifier as claimed in claim 9, wherein said gm-connected N-channel transistor (N7) is geometrically matched to said N-channel clamping transistor (N10).

11. A non-linear amplifier as claimed in claim 8, wherein said P-channel clamping transistor (P10) is turned on only when the output signal on the output node increases above said first reference voltage (P-REFERENCE).

12. A non-linear amplifier as claimed in claim 11, wherein said N-channel clamping transistor (N10) is turned on only when the output signal on the output node decreases below said second reference voltage (N-REFERENCE).

* * * * *